(12) United States Patent
Tanaka et al.

(10) Patent No.: US 8,698,095 B2
(45) Date of Patent: Apr. 15, 2014

(54) CHARGED PARTICLE BEAM DRAWING APPARATUS AND ARTICLE MANUFACTURING METHOD

(75) Inventors: Ichiro Tanaka, Utsunomiya (JP); Akira Miyake, Nasukarasuyama (JP); Hiromitsu Takase, Utsunomiya (JP)

(73) Assignee: Canon Kabushiki Kaisha (JP)

( * ) Notice: Subject to any disclaimer, the term of this patent is extended or adjusted under 35 U.S.C. 154(b) by 56 days.

(21) Appl. No.: 13/343,752

(22) Filed: Jan. 5, 2012

(65) Prior Publication Data
US 2012/0178025 A1 Jul. 12, 2012

(30) Foreign Application Priority Data

Jan. 7, 2011 (JP) ................................. 2011-001991

(51) Int. Cl.
*G21K 5/04* (2006.01)

(52) U.S. Cl.
USPC ................ 250/396 R; 250/397; 250/492.1; 250/492.2; 250/492.3

(58) Field of Classification Search
USPC .......... 250/396 R, 397, 492.1, 492.2, 492.21, 250/492.22, 492.3
See application file for complete search history.

(56) References Cited

U.S. PATENT DOCUMENTS

| 5,539,211 A | 7/1996 | Ohtoshi et al. |
| 2005/0211925 A1* | 9/2005 | Nakasuji et al. ......... 250/492.21 |
| 2011/0017247 A1* | 1/2011 | Vane et al. .................... 134/198 |
| 2012/0288799 A1* | 11/2012 | Takase et al. ................. 430/296 |

FOREIGN PATENT DOCUMENTS

JP 8-139010 A 5/1996

* cited by examiner

*Primary Examiner* — Nicole Ippolito
(74) *Attorney, Agent, or Firm* — Rossi, Kimms & McDowell LLP

(57) ABSTRACT

The charged particle beam drawing apparatus of the present invention performs drawing to a substrate with a plurality of charged particle beams. The drawing apparatus includes an electron lens positioned at a location facing opposite to the substrate and including a plurality of holes through which the charged particle beams pass; and a cleaning unit configured to release active species to a decomposition product that has adhered to the electron lens and reduce the decomposition product by the reaction of the active species and the decomposition product to thereby change the decomposition product to a volatile gas. Here, the cleaning unit has a plurality of openings formed such that the active species are released toward the plurality of holes of the electron lens.

8 Claims, 5 Drawing Sheets

CHARGED PARTICLE BEAM DRAWING APPARATUS AND ARTICLE MANUFACTURING METHOD

BACKGROUND OF THE INVENTION

1. Field of the Invention

The present invention relates to a charged particle beam drawing apparatus having a cleaning mechanism, and an article manufacturing method using the same.

2. Description of the Related Art

In recent years, as micronization of elements, increasingly complex circuit patterns, or a higher capacity of pattern data advance, the drawing accuracy as well as drawing throughput of charged particle beam drawing apparatuses for use in the manufacturing of devices such as semiconductor integrated circuits needs to be improved. However, if an electron lens positioned above a substrate to be treated is formed with, for example, fine apertures (holes), secondary electrons emitted from a resist and an out gas act with each other, and thus, contamination (decomposition product) adheres to the surface of and inside the apertures. Accumulations of such contamination may significantly affect on the drawing position accuracy, aberration, and the like of the electron lens. Thus, Japanese Patent Laid-Open No. 8-139010 discloses a charged beam apparatus that has a gas generation unit for generating gas for removing internal contamination consisting at least one of the plasma or radicals (active species) and cleans a portion of an interior of the apparatus using the generated plasma or radicals.

However, in the charged beam apparatus disclosed in Japanese Patent Laid-Open No. 8-139010, the conductance of fine apertures provided in the electron lens is small, and thus, radicals may be deactivated or radicals may not sufficiently reach such contamination. Consequently, such contamination may not be sufficiently cleaned.

SUMMARY OF THE INVENTION

Accordingly, the present invention provides a charged particle beam drawing apparatus having a cleaning mechanism that is advantageous in removing contamination adhering to the interior of the holes provided in an electron lens.

According to an aspect of the present invention, a drawing apparatus that performs drawing on a substrate with a plurality of charged particle beams is provided that includes an electron lens positioned at a location facing opposite to the substrate and including a plurality of holes through which the charged particle beams pass; and a cleaning unit configured to release active species to a decomposition product that has adhered to the electron lens and reduce the decomposition product by the reaction of the active species and the decomposition product to thereby change the decomposition product to a volatile gas, wherein the cleaning unit has a plurality of openings formed such that the active species are released toward the plurality of holes of the electron lens.

According to the present invention, a charged particle beam drawing apparatus having a cleaning mechanism that is advantageous in removing contamination adhering to the interior of the holes provided in an electron lens may be provided.

Further features of the present invention will become apparent from the following description of exemplary embodiments with reference to the attached drawings.

DESCRIPTION OF THE EMBODIMENTS (First Embodiment)

Figure 1:
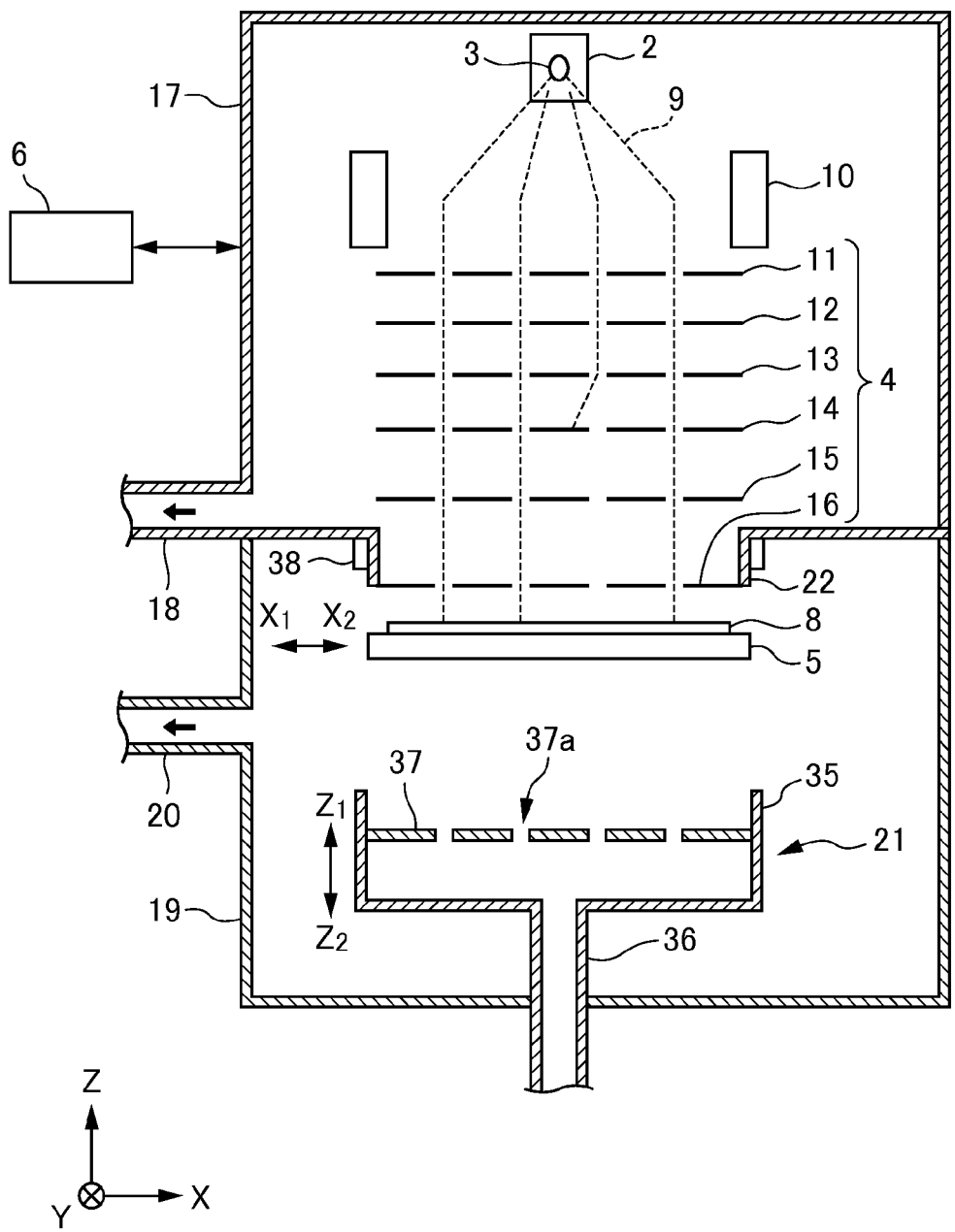
FIG. 1 is a diagram illustrating the configuration of a charged particle beam drawing apparatus according to a first embodiment of the present invention.

Firstly, a description will be given of a charged particle beam drawing apparatus (hereinafter referred to simply as "drawing apparatus") according to a first embodiment of the present invention. Hereinafter, each of the drawing apparatuses to be described in the following embodiments is intended to employ a multiple beam system in which a plurality of electron beams is deflected and the ON/OFF operation of the irradiation of electron beams is independently controlled so as to draw predetermined drawing data at the predetermined position on a wafer (substrate to be treated). Here, a charged particle beam of the present embodiment is not limited to an electron beam, but may be other charged particle beams such as an ion beam. FIG. 1 is a diagram illustrating the configuration of a drawing apparatus according to the present embodiment. Also, in the following drawings, a description will be given in which the Z axis is in an irradiation direction of an electron beam to a substrate to be treated, and the X axis and the Y axis are mutually oriented in directions orthogonal to a plane perpendicular to the Z axis. A drawing apparatus 1 first includes an electron gun 2, an optical system 4 that splits an electron beam emitted from a crossover 3 of the electron gun 2 into a plurality of electron beams, and deflects and focuses the plurality of electron beams, a substrate stage 5 that holds a wafer 8, and a controller 6 that controls the operation of the components of the drawing apparatus 1. Also, the wafer 8 is an object to be treated consisting of, for example, single crystal silicon. A photosensitive resist is coated on the surface of the wafer 8.

The electron gun 2 has a mechanism that emits an electron beam by applying heat or electric field. In FIG. 1, tracks 9 of electron beams emitted from the crossover 3 are shown by dotted lines. The optical system 4 includes a collimator lens 10, an aperture array 11, a first electrostatic lens 12, a blanking deflector 13, a stopping aperture array 14, a deflector 15, and a second electrostatic lens 16 in the recited order from the electron gun 2 to the substrate stage 5. The collimator lens 10 is an optical element that is constituted by an electromagnetic lens and collimates a plurality of electron beams emitted from the crossover 3 into collimated beams. The aperture array 11 is a mechanism that has a plurality of circular openings arranged in a matrix form and splits an electron beam incident from the collimator lens 10 into a plurality of electron beams. The first electrostatic lens 12 is an optical element that is constituted by three electrode plates (in FIG. 1, three electrode plates are shown integrally as an integrated plate) each having a circular opening and focuses an electron beam to the stopping aperture array 14. Both of the blanking deflector (blanker) 13 and the stopping aperture array 14 are mechanisms that are arranged in a matrix form and perform the ON/OFF operation of the irradiation of each electron beam. In particular, the stopping aperture array 14 is arranged at a position at which the first electrostatic lens 12 first forms the crossover of an electron beam. The deflector 15 is a mechanism that deflects an image on the surface of the wafer 8, which is placed on the substrate stage 5, in the X direction. Furthermore, the second electrostatic lens 16 is an optical element that focuses an electron beam, which has passed through the stopping aperture array 14, onto the wafer 8. The second electrostatic lens 16 is positioned facing opposite to the location to the wafer 8 in a drawing step.

The substrate stage 5 is a substrate holding unit that holds the wafer 8 using, for example, electrostatic adsorption, and is movable to the irradiation position of an electron beam in the XY plane. Furthermore, the controller 6 may control the operation, adjustment, and the like of the components of the drawing apparatus 1. The controller 6 is constituted by, for example, a computer or the like, and may be connected to the components of the drawing apparatus 1 via a line so as to execute control of the components in accordance with a program or the like.

Here, an electron beam has immediate attenuation properties under atmosphere at ambient pressure. Hence, the drawing apparatus 1 includes a lens barrel 17 serving as a vacuum chamber for surrounding the electron gun 2 and the optical system 4 so as also to prevent discharge due to a high voltage. The interior of the lens barrel 17 is maintained at a high degree of vacuum of, for example, $10^{-5}$ Pa or less via a first exhaust port 18 using a vacuum exhaust system (not shown). On the other hand, the drawing apparatus 1 includes a stage chamber 19, which surrounds the substrate stage 5 and a cleaning mechanism to be described below, connected with the lens barrel 17. The interior of the stage chamber 19 is maintained at a degree of vacuum via a second exhaust port 20 using another vacuum exhaust system separately from the vacuum exhaust system described above. The degree of vacuum of the interior of the stage chamber 19 may be set lower than that of the interior of the lens barrel 17. In the present embodiment, the lens barrel 17 and the stage chamber 19 have different internal pressures. However, the lens barrel 17 and the stage chamber 19 may also have the same internal pressure using one vacuum exhaust system.

In general, when electron beams are irradiated on the resist on the wafer 8, an organic component gas is released out from the resist. At the same time, secondary electrons are also released out therefrom. Thus, gaseous contamination (decomposition product) adheres in particular not only to the surface of a second electrostatic lens (electron lens) 16 near the resist surface but also to the sides of apertures (holes) provided in the second electrostatic lens 16 due to such phenomena. Such contamination may often be mainly composed of carbon. Accordingly, the drawing apparatus 1 of the present embodiment includes a cleaning mechanism 21 for removing contamination provided within the interior of the stage chamber 19.

Figure 2:
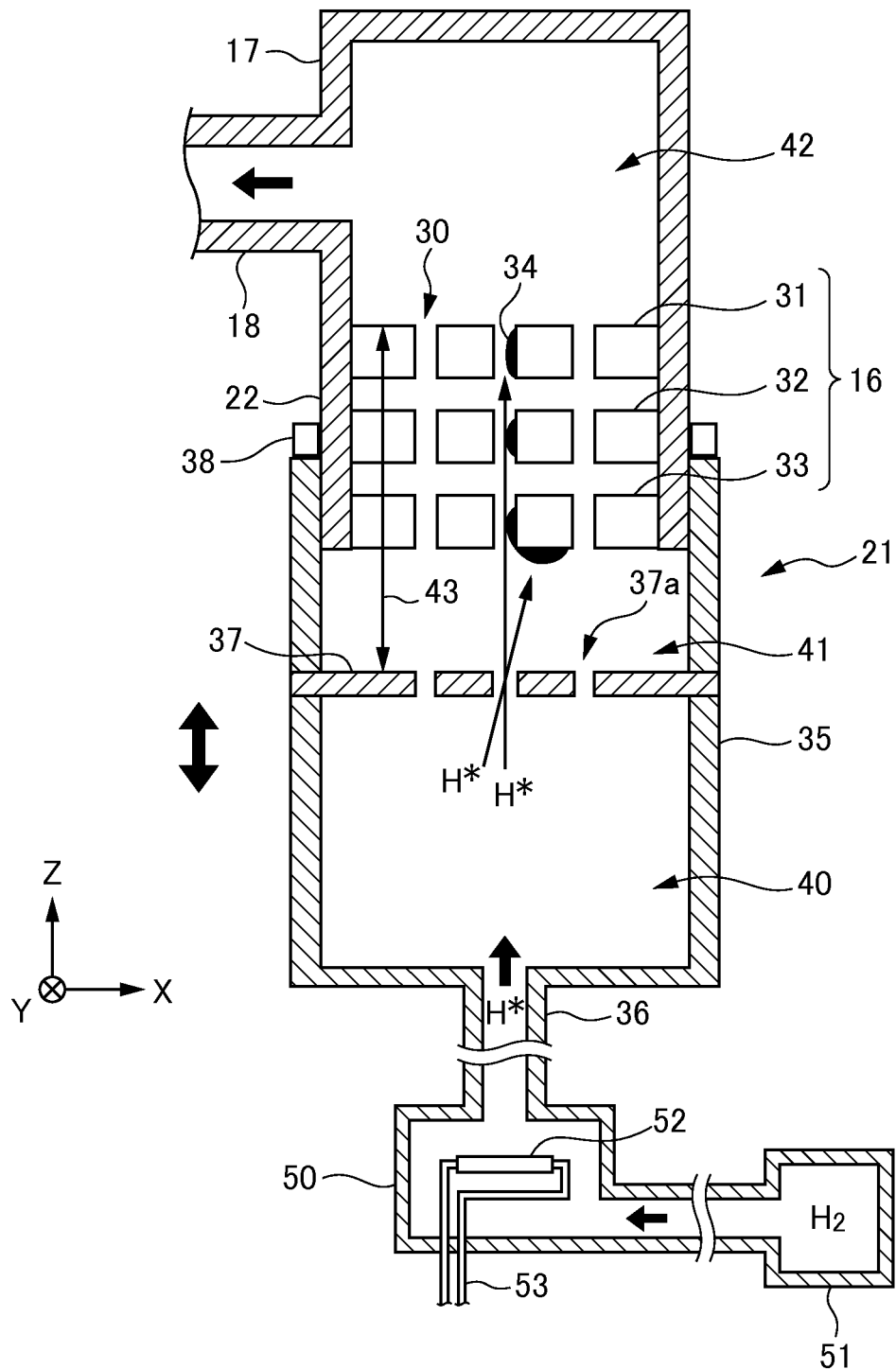
FIG. 2 is a diagram illustrating a lens barrel and a cleaning mechanism in the connected state.

FIG. 2 is a schematic diagram illustrating the second electrostatic lens 16 encapsulated by the lens barrel 17 and the cleaning mechanism 21 encapsulated by the stage chamber 19. In particular, FIG. 2 shows a state in which the second electrostatic lens 16 is cleaned by the cleaning mechanism 21 before the properties of the optical system 4 change due to contamination adhered to the second electrostatic lens 16 and the drawing accuracy thereby deteriorates so as to become worse than a predetermined criteria. More specifically, FIG. 2 shows a state in which the controller 6 temporarily stops a drawing step such that the substrate stage 5 is retracted from the drawing position in the $X_1$ direction shown in FIG. 1, and the cleaning mechanism 21 retracted below the substrate stage 5 is moved upward in the $Z_1$ direction shown in FIG. 1 so as to bring the cleaning mechanism 21 into connection with the fixing unit 22 of the second electrostatic lens 16. Here, the configuration of only the second electrostatic lens 16 is described in the interior of the lens barrel 17 in FIG. 2 for ease of explanation. As shown in FIG. 2, the second electrostatic lens 16 includes three electrodes (a first electrode 31, a second electrode 32, and a third electrode 33) each formed of a conductor having holes (openings) 30 through which a plurality of electron beams passes. Each of the electrodes 31 to 33 coaxially arranges all of the holes 30 formed therein, and is supported by the interior of the fixing unit 22 which is a portion of the lens barrel 17.

The cleaning mechanism 21 is a cleaning unit that releases radicals (active species: for example, hydrogen radical H*) to the second electrostatic lens 16 and reduces contamination 34 by the reaction of the radicals and the contamination 34 that has adhered to the second electrostatic lens 16 to thereby change the contamination 34 to volatile gas. The cleaning mechanism 21 includes a box-type main body 35 that is opened such that a plane facing opposite to the second electrostatic lens 16 is capable of being connected to the fixing unit 22 for supporting the second electrostatic lens 16, and a post unit 36 that supports the main body 35 and is capable of moving the main body 35 in the vertical direction (Z direction). Also, the cleaning mechanism 21 includes a radical generation unit (active species generation unit) 50 that generates a radical H*, and a raw material gas supply unit 51 that supplies a raw material gas (e.g., hydrogen gas) to the radical generation unit 50, both of which are provided at the exterior of the stage chamber 19. In the present embodiment, a radical H* generated by the radical generation unit 50 is supplied to the main body 35 through the internal space of the post unit 36. The material for the interior of the post unit 36 may be quartz having a small deactivation effect on hydrogen radicals. The radical generation unit 50 includes a hot filament 52 of tungsten inside thereof. The hot filament 52 is connected to a power source (not shown) via a lead wire 53. Upon generation of radicals, the hot filament 52 is heated approximately to 1700° C. by the current supplied from the power source. In the radical generation unit 50, hydrogen molecules supplied to the interior thereof are decomposed by the catalytic effect of high temperature tungsten to thereby become hydrogen radicals H*. In general, when the temperature of the lens barrel 17 rises, a misalignment occurs in the holes 30 provided in the second electrostatic lens 16, resulting in a possible deterioration in drawing accuracy. Hence, it is necessary to wait for recovery to a normal temperature after the cleaning step. In contrast, in the present embodiment, the radical generation unit 50 is disposed at a position away from the lens barrel 17, and thus, heat generated during radical generation is not readily transferred to the lens barrel 17. Thus, the temperature rise in the lens barrel 17 is suppressed during a cleaning step, whereby the effect on throughput of the drawing apparatus 1 may be suppressed.

Furthermore, the cleaning mechanism 21 has an aperture array (opening array) 37, which is disposed on the surface toward the second electrostatic lens 16 of the main body 35, having a plurality of apertures (openings) 37a. Here, the positions where the apertures 37a are provided in the aperture array 37 are arranged at positions extending vertically from the positions where the holes 30, which are provided in the electrodes 31 to 33 of the second electrostatic lens 16, are provided. In particular, it is preferable that the positions where the apertures 37a are provided are coaxial with the positions where the holes 30 are provided in the vertical direction. Here, the lens barrel 17 includes a positioning mechanism 38 that determines the positions of the apertures 37a with respect to the positions of the holes 30 when the main body 35 is connected to the fixing unit 22. The positioning mechanism 38 may be an abutting mechanical mechanism or a detector such as a position measurement sensor, a CCD, or the like. It is preferable that a hermetic seal be disposed at the contact portion (engagement portion) when the fixing unit 22 is brought into contact with the main body 35 so as to prevent the internal raw material gas from leaking to the outside.

Next, a description will be given of the effect of the drawing apparatus 1. In the drawing step, the controller 6 first continuously moves the wafer 8 in the X direction by driving the substrate stage 5 while irradiating electron beams using the electron gun 2. At this time, the controller 6 causes the deflector 15 to perform deflection in the Y direction and also causes a blanking deflector to perform blanking as appropriate on the basis of the length-measured result in real time using a laser length-measuring device (not shown) to thereby form a desired latent image on the resist surface on the wafer 8. When such a drawing step is carried out to some extent, contamination adheres to the second electrostatic lens 16 as described above. Thus, the controller 6 executes a cleaning step (contamination removing step) using the cleaning mechanism 21.

In the cleaning step, the controller 6 first causes the first exhaust port 18 to perform vacuum pumping by disposing the cleaning mechanism 21 at the fixing unit 22 of the lens barrel 17 as shown in FIG. 2. Hereinafter, in the installation state of the cleaning mechanism 21, space extending from the post unit 36 to the aperture array 37 within the interior of the main body 35 is defined as a first region 40, and space sandwiched between the aperture array 37 and the second electrostatic lens 16 is defined as a second region 41. Likewise, space in which the second electrostatic lens 16 is installed in the interior of the lens barrel 17 is defined as a third region 42. Next, the controller 6 activates the raw material gas supply unit 51 and the radical generation unit 50, and releases the generated radicals H* from the first region 40 toward the second region 41 via the apertures 37a. Here, the apertures 37a of the present embodiment are arranged at the positions extending vertically from the positions where the holes 30 in the electrodes 31 to 33 are provided. Hence, the radicals H* released from the apertures 37a not only enter the bottom surface of the third electrode 33 but also enter into the deepest part of the holes 30 while maintaining an appropriate angle of entry as shown in FIG. 2 to thereby reach the contamination 34 adhered to the side surfaces of the holes 30 in the electrodes 31 to 33. At this time, the contamination 34 is reduced to a volatile gas by the reaction of the radicals H* and the contamination 34, and thus, the volatile gas is discharged from the first exhaust port 18. Consequently, the removal of the contamination 34 is ended. Then, the controller 6 stops supplying raw material gas after completion of the cleaning step or after the elapse of a predetermined period of time after completion of the cleaning step to thereby end generation of the radicals H*. Next, the controller 6 causes the cleaning mechanism 21 to retract in the $Z_2$ direction, evacuates the interior of each of the lens barrel 17 and the stage chamber 19, and resumes the drawing step after the internal pressure of the lens barrel 17 and the stage chamber 19 is equal to or less than a predetermined pressure.

Next, a specific description will be given of the internal pressure and the dimensions of the lens barrel 17 and the stage chamber 19 in the cleaning step, where a raw material gas is hydrogen. In FIG. 2, if the maximum pressure between the second region 41 and the third region 42 is smaller than the mean free path of hydrogen radicals in the mixture system with hydrogen molecules and hydrogen atoms (hydrogen radicals), hydrogen radicals released from the apertures 37a linearly advance toward the second electrostatic lens 16. Therefore, hydrogen radicals directly reach the target to be cleaned of the second electrostatic lens 16, and thus, the contamination 34 is efficiently removed. In this case, the mean free path of hydrogen radical is represented by the following Formula 1:

$$\lambda_a = \frac{1}{\sqrt{2}\,\pi d_a^2 n_a + \pi\left(\dfrac{d_a+d_b}{2}\right)^2 n_b \sqrt{1+\dfrac{M_a}{M_b}}} \quad \text{[Formula 1]}$$

where the symbol "$d_a$" is the atomic radius (cm) of hydrogen radical (hydrogen atom), the symbol "$d_b$" is the molecular radius (cm) of hydrogen molecules, the symbol "$n_a$" is the atom density (1/cm$^3$) of hydrogen radical, and the symbol "$n_b$" is the molecule density (1/cm$^3$) of hydrogen molecules. Furthermore, the symbol "$M_a$" is the mass number of hydrogen radical, and the symbol "$M_b$" is the mass number of hydrogen molecules. Here, let it be assumed that $d_a$=6.20 E-9, $d_b$=1.24 E-8, and the concentration of hydrogen radicals is 1%, the mean free path $\lambda_a$ of hydrogen radical under a pressure of 50 Pa is 2.3 mm. In other words, if the pressure in each of the second and the third regions 41 and 42 is 50 Pa or less and the distance 43 from the aperture 37a to the deepest part of the second electrostatic lens 16 is 2.3 mm or less, a large number of hydrogen radicals H* reaches the first electrode 31, which is positioned at the innermost portion of the second electrostatic lens 16.

Here, for example, the controller 6 introduces hydrogen gas including 1% of hydrogen radicals from the post unit 36 at a flow rate Q of 2.1 Pa·m$^3$/sec, and discharges hydrogen gas from the first region 40 through the path of the third region 42 to the first exhaust port 18. At this time, the controller 6 adjusts the exhaust rate of the first exhaust port 18 such that the exhaust rate at the outlet side (the third region 42 side) of the first electrode 31 is 0.1 m$^3$/sec. With this arrangement, the flow rate of hydrogen gas to be discharged from the first exhaust port 18 is substantially the same as that of hydrogen gas to be introduced from the post unit 36. Furthermore, in the present embodiment, each of the holes 30 in the electrodes 31 to 33 of the second electrostatic lens 16 has a diameter of 120 μm and a thickness of 300 μm. In contrast, each of the apertures 37a has a diameter of 40 μm and a thickness of 300 μm. Also, the apertures 37a and the holes 30 formed in one electrode of the second electrostatic lens 16 are arranged in a square array of 130×130 (16,900). In this case, the pressure in the first region 40 is 163 Pa, the pressure in the second region 41 is 36 Pa, and the pressure in the third region 42 is 21 Pa. While the number of the apertures 37a installed is the same as the number of the holes 30, the number of the apertures 37a installed may be greater than that of the holes 30. These conditions as described above allow a large number of hydrogen radicals H* emitted from the apertures 37a to be directed toward the holes 30 in the first to third electrodes 31 to 33, and thus, the contamination 34 may be efficiently removed. Furthermore, with this arrangement, the cleaning mechanism 21 may set the pressure in the first region 40 at a high level, and thus, a sufficient amount of radicals may be ensured. As described above, although a description has been given by using hydrogen gas as a raw material gas, another gas such as ammonia, oxygen, ozone, or the like may also be used provided that radicals effective for removing the contamination 34 may be generated therefrom.

Next, a description will be given of the tolerance of axial misalignment between the holes 30 in the electrodes 31 to 33 of the second electrostatic lens 16 and the apertures 37a of the cleaning mechanism 21. As described above, when the apertures 37a are located on the axes of the holes 30, the cleaning mechanism 21 may provide a sufficient cleaning effect. In contrast, even when the axes of the apertures 37a and the axes of the holes 30 are misaligned with each other by as much as half of the diameter of the hole 30, the cleaning mechanism 21 may remove the contamination 34 that has adhered to the holes 30. For example, in the cleaning mechanism 21 to which the aforementioned conditions are applied, the tolerance of axial misalignment between the holes 30 and the apertures 37a is 40 µm.

Figure 3:
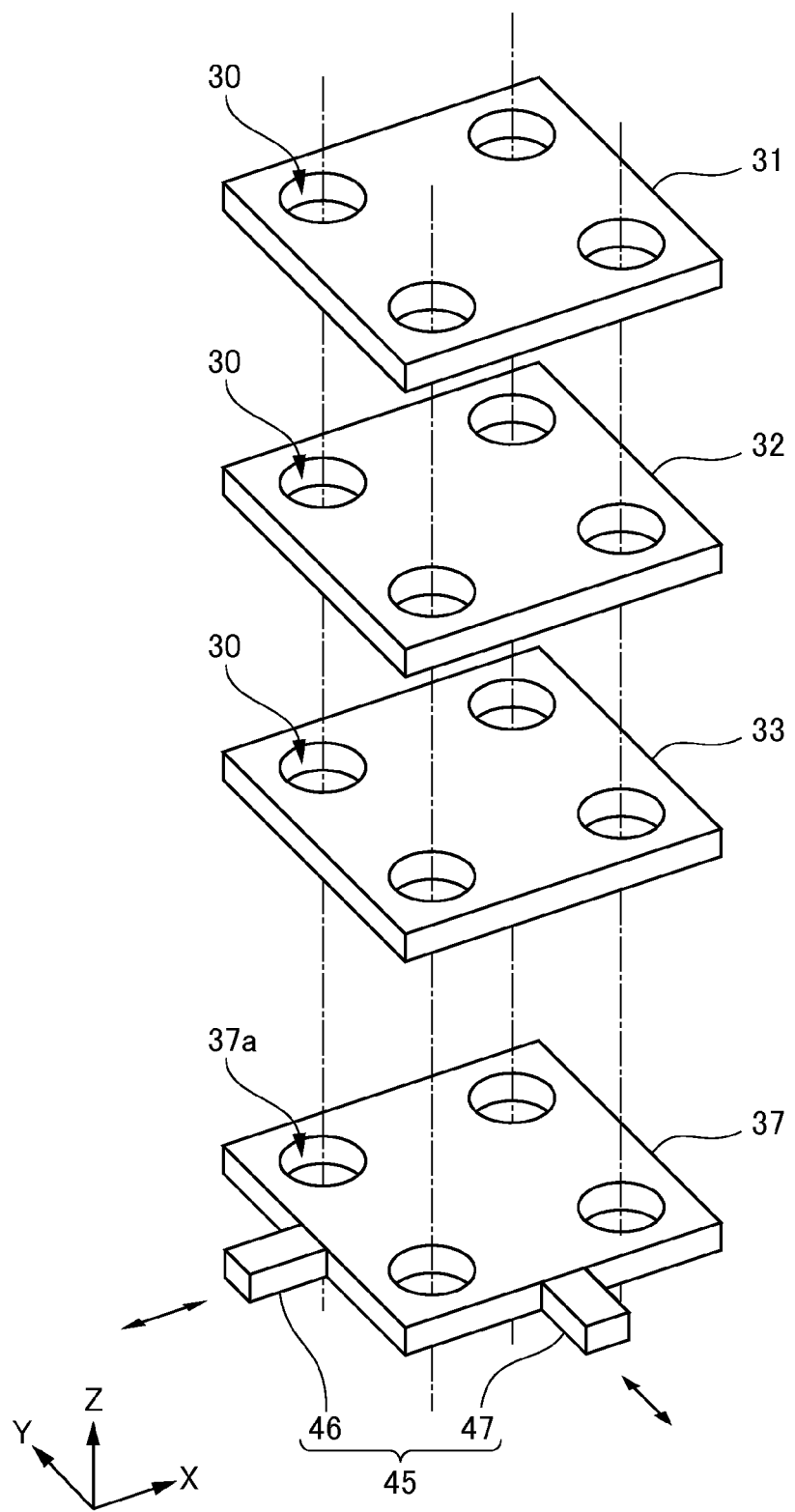
FIG. 3 is a schematic diagram illustrating a drive mechanism for driving an aperture array.

Here, in order to accommodate the case where axial misalignment between the holes 30 and the apertures 37a is outside predetermined tolerance limits, for example, a drive mechanism that adjusts the position of the aperture array 37 in the horizontal direction (X and Y directions) may also be provided in the cleaning mechanism 21. FIG. 3 is a schematic perspective view illustrating the positional relationship between the holes 30 in the electrodes 31 to 33 and the apertures 37a and a drive mechanism 45 provided in the aperture array 37. In this case, the drive mechanism 45 includes a first drive unit 46 that is capable of driving the aperture array 37 in the X direction, and a second drive unit 47 that is capable of driving the aperture array 37 in the Y direction. Note that the drive mechanism 45 may drive only the aperture array 37 or may change the position of the aperture array 37 by driving the main body 35 of the cleaning mechanism 21. The amount of axial misalignment between the holes 30 and the apertures 37a is detected by a hole misalignment detection device (not shown) that is provided on either the cleaning mechanism 21 or the lens barrel 17. Examples of such hole misalignment detection devices that can be used include a microscope, a CCD camera, the combination of these and an image processing device, and the like. At this time, the controller 6 drives the drive mechanism 45 based on the amount of misalignment detected by the hole misalignment detection device, and adjusts the positions of the apertures 37a so as to minimize axial misalignment. With this arrangement, the drawing apparatus 1 is capable of readily modifying axial misalignment between the apertures 37a and the holes 30. Therefore, the drawing apparatus 1 may instantly accommodate the time profile of the relative position of the apertures 37a with respect to the holes 30, or may also mitigate the mechanical accuracy of a connection mechanism for connecting the cleaning mechanism 21 with respect to the fixing unit 22, or the like.

As described above, according to the present embodiment, the contamination 34 that has adhered to the deepest part of the holes 30, i.e., the targets to be cleaned, may be efficiently cleaned. Furthermore, as compared with a cleaning mechanism without the apertures 37a, the pressure within the interior of the lens barrel 17 may be reduced, resulting in a reduction in the vacuum exhaust time after the cleaning step. Consequently, any down-time attendant to cleaning processing may be kept short.

(Second Embodiment)

Figure 4:
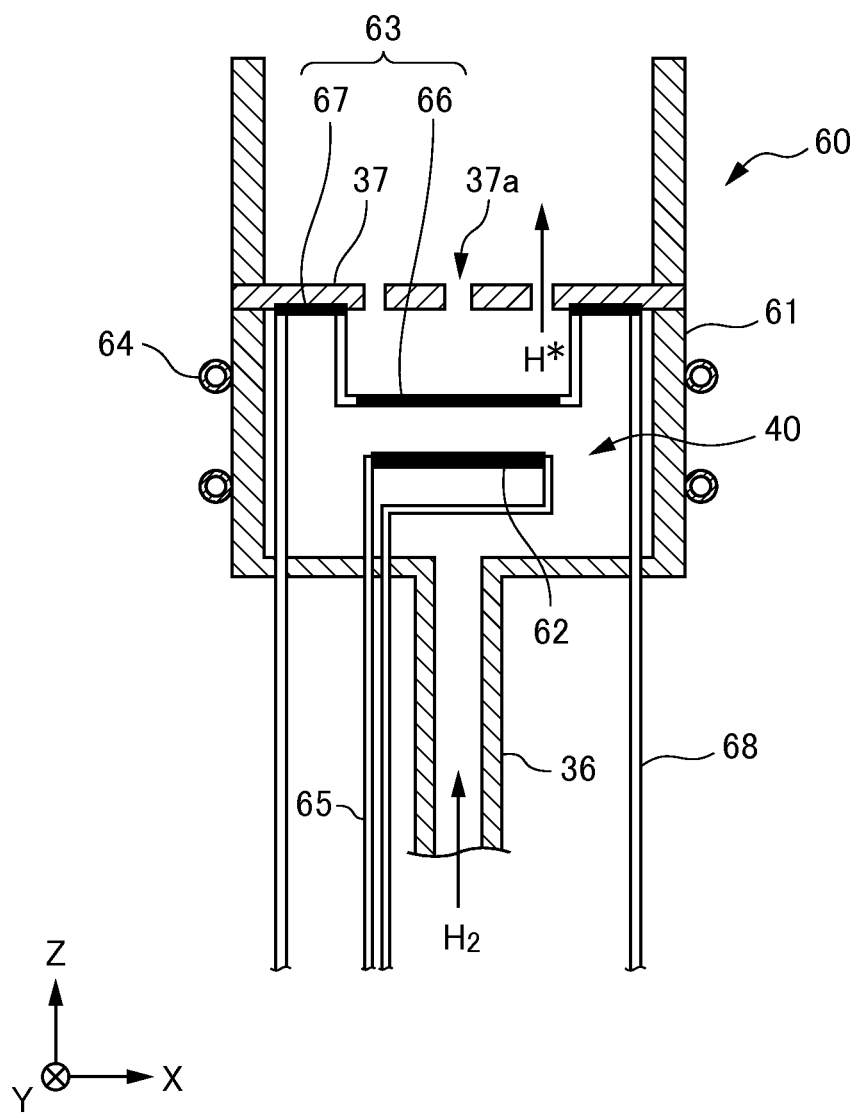
FIG. 4 is a diagram illustrating the configuration of a cleaning mechanism according to a second embodiment of the present invention.

Next, a description will be given of a drawing apparatus according to a second embodiment of the present invention. FIG. 4 is a diagram illustrating the configuration of a cleaning mechanism 60 of the present embodiment. In FIG. 4, the same components as those in the cleaning mechanism 21 shown in FIG. 2 are designated by the same reference numerals and explanation thereof will be omitted. A feature of the drawing apparatus of the present embodiment lies in the fact that a cleaning mechanism 60 corresponding to the cleaning mechanism 21 of the first embodiment generates radicals H* in the interior of a main body 61. In this case, the main body 61 includes a hot filament 62 of tungsten inside thereof (the first region 40), and an internal cooling mechanism 63, and further includes an external cooling mechanism 64 outside thereof. Also, the main body 61 is connected to a raw material gas supply unit (not shown) via the post unit 36, and a raw material gas is supplied to the first region 40 via the inner tube of the post unit 36. The hot filament 62 is connected to a power source (not shown) via a lead wire 65. The internal cooling mechanism 63 includes a cooling plate 66 and an aperture array cooling mechanism 67. Both the cooling plate 66 and the aperture array cooling mechanism 67 are connected to a refrigerant conducting conduit 68 extending from a refrigerant supply mechanism (not shown) installed on the outside of the stage chamber 19. Also, the external cooling mechanism 64 is a refrigerant conducting conduit extending along the outer periphery of the main body 61. The cleaning mechanism 60 cools the main body 61 and the aperture array 37 by circulating refrigerant through the refrigerant conducting conduit 68 and the external cooling mechanism 64. With this arrangement, the cleaning mechanism 60 includes such cooling mechanisms provided inside/outside a radical generation unit of the main body 61, and thus, heat generated in the hot filament 62 is prevented from being transferred to the lens barrel 17 side.

(Third Embodiment)

Figure 5:
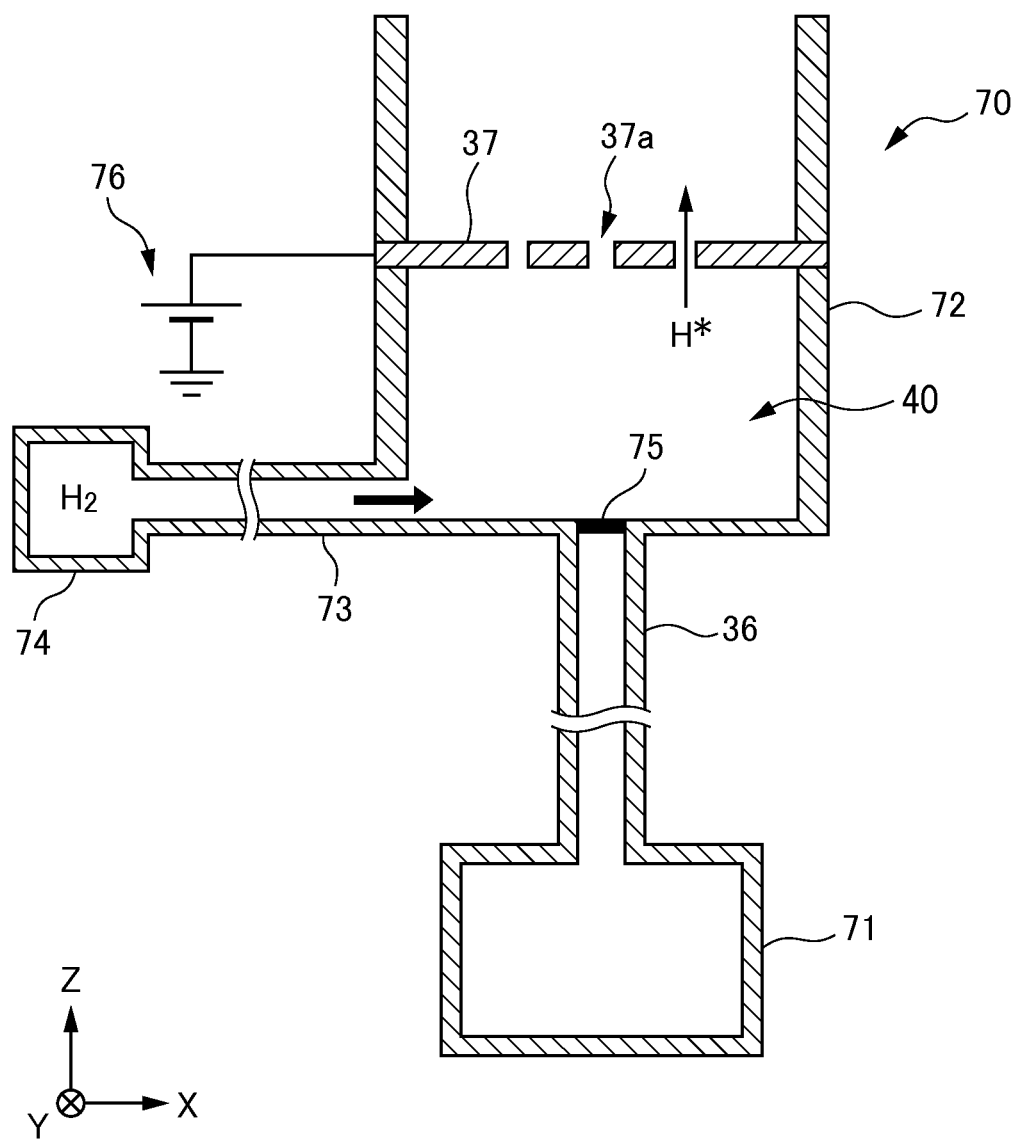
FIG. 5 is a diagram illustrating the configuration of a cleaning mechanism according to a third embodiment of the present invention.

Next, a description will be given of a drawing apparatus according to a third embodiment of the present invention. FIG. 5 is a diagram illustrating the configuration of a cleaning mechanism 70 of the present embodiment. In FIG. 5, the same components as those in the cleaning mechanism 21 shown in FIG. 2 are designated by the same reference numerals and explanation thereof will be omitted. A feature of the drawing apparatus of the present embodiment lies in the fact that a cleaning mechanism 70 of the present embodiment includes a microwave generator 71 for generating radicals H* while the cleaning mechanism of the first and second embodiments includes a hot filament for generating radicals H*. In this case, a main body 72 is connected to a microwave generator 71 via the post unit 36, and is also connected to a raw material gas supply unit 74 via a conducting conduit 73 separately from the post unit 36. In the present embodiment, the inner tube of the post unit 36 is a waveguide for guiding microwaves, the outlet section of the waveguide is connected to the main body 72 via a quartz window 75. Since the internal space between the post unit 36 and the microwave generator 71 does not have to be in a vacuum state, the quartz window 75 is provided with a vacuum seal such that external gas does not enter the interior of the main body 72. In the cleaning mechanism 70, the controller 6 first introduces a raw material gas (hydrogen gas) from the raw material gas supply unit 74 to the first region 40 within the main body 72. Next, the controller 6 impinges the microwave generated in the microwave generator 71 on the first region 40 via the quartz window 75. At this time, the microwave acts on a raw material gas, and thus, radicals H* are generated in the first region 40. In this configuration, high speed ions are generated by the effect of plasma generated in the first region 40. Hence, the second electrostatic lens 16 may be damaged due to collisions with ions. Accordingly, the cleaning mechanism 70 includes a biasing device 76 that applies a positive potential to the aperture 37. At this time, an electric voltage to be applied by the biasing device 76 may be in the range of about 10 V to 100 V. The generated positive ions are pushed back by the application of an electric voltage, and thus, the second electrostatic lens 16 may be prevented from being damaged. On the other hand, in the case where negative ions are generated, the cleaning mechanism 70 may further include a biasing device that applies a negative electric voltage to the second electrostatic lens 16. In this case, an electric voltage to be applied may be in the range of about −10 V to −100 V. The generated negative ions are also pushed back by the application of an electric voltage, and thus, the second electrostatic lens 16 may be prevented from being damaged.

(Article Manufacturing Method)

An article manufacturing method according to an embodiment of the present invention is preferred in, for example, manufacturing a micro device such as a semiconductor device or the like or an article such as an element or the like having a microstructure. The article manufacturing method may include the steps of forming, in a latent image pattern step, a latent image pattern on a substrate on which a photosensitizing agent is coated using the aforementioned drawing apparatus; and developing the substrate on which the latent image pattern has been formed in the latent image pattern step. Furthermore, the article manufacturing method may include other known steps (oxidizing, film forming, vapor depositing, doping, flattening, etching, resist peeling, dicing, bonding, packaging, and the like). The article manufacturing method of the present embodiment has an advantage, as compared with a conventional article manufacturing method, in at least one of performance, quality, productivity and production cost of an article.

While the embodiments of the present invention have been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-001991 filed Jan. 7, 2011 which is hereby incorporated by reference herein it its entirety.

What is claimed is:

1. A drawing apparatus that performs drawing on a substrate with a plurality of charged particle beams, the drawing apparatus comprising:
    an electron lens positioned at a location facing opposite to the substrate and including a plurality of holes through which the charged particle beams pass; and
    a cleaning unit configured to release active species to a decomposition product that has adhered to the electron lens and reduce the decomposition product by the reaction of the active species and the decomposition product to thereby change the decomposition product to a volatile gas,
    wherein the cleaning unit has a plurality of openings formed such that the active species are released toward the plurality of holes of the electron lens, and
    wherein each opening of the cleaning unit is disposed opposite to each of the holes.

2. The drawing apparatus according to claim 1, wherein each opening of the cleaning unit is configured concentrically with the holes corresponding to the electron lens.

3. The drawing apparatus according to claim 1, wherein the cleaning unit comprises a main body that is opened such that a plane facing opposite to the electron lens is capable of being connected to a fixing unit for supporting the electron lens, and the main body comprises an opening array having the plurality of openings provided in the plane.

4. The drawing apparatus according to claim 3, wherein the cleaning unit comprises a drive mechanism that drives the opening array so as to align the position of the openings with the position of the holes.

5. The drawing apparatus according to claim 3, further comprising:
    a substrate holding unit configured to place the substrate to be treated and be movable based on the drawing position; and
    a controller configured to control the operation of the substrate holding unit and the cleaning unit,
    wherein the cleaning unit comprises a post unit that supports the main body and is capable of moving the main body toward the fixing unit, and
    wherein, when the active species are released, the controller moves the substrate holding unit from the drawing position, and then moves the post unit toward the fixing unit to thereby bring the main body into connection with the fixing unit.

6. The drawing apparatus according to claim 3, wherein, when the main body is brought into connection with the fixing unit, the distance from the opening to the deepest part of the electron lens is shorter than the mean free path of the active species at the maximum pressure in a region from the openings to the electron lens.

7. The drawing apparatus according to claim 1, wherein the number of openings is equal to the number of holes or is greater than the number of holes.

8. An article manufacturing method, comprising:
    performing, in a performing step, drawing on a substrate with a plurality of charged particle beams using a drawing apparatus; and
    developing, in a developing step, the substrate on which the drawing has been performed in the drawing step,
    wherein the drawing apparatus comprises:
    an electron lens positioned at a location facing opposite to the substrate and including a plurality of holes through which the charged particle beams pass; and
    a cleaning unit configured to release active species to a decomposition product that has adhered to the electron lens and reduce the decomposition product by the reaction of the active species and the decomposition product to thereby change the decomposition product to a volatile gas,
    wherein the cleaning unit has a plurality of openings formed such that the active species are released toward the plurality of holes of the electron lens, and
    wherein each opening of the cleaning unit is disposed opposite to each of the holes.

* * * * *